(12) United States Patent
Wright et al.

(10) Patent No.: US 6,716,363 B1
(45) Date of Patent: Apr. 6, 2004

(54) ELECTRODE PATTERNING FOR A DIFFERENTIAL PZT ACTIVATOR

(75) Inventors: John Stuart Wright, Bloomington, MN (US); Zine-Eddine Boutaghou, Vadnais Heights, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/600,760

(22) PCT Filed: Apr. 20, 2000

(86) PCT No.: PCT/US00/10601

§ 371 (c)(1),
(2), (4) Date: Jan. 14, 2002

(87) PCT Pub. No.: WO00/63978

PCT Pub. Date: Oct. 26, 2000

Related U.S. Application Data

(60) Provisional application No. 60/254,966, filed on Apr. 20, 1999.

(51) Int. Cl.[7] .......................... H01L 41/08; H01B 13/00
(52) U.S. Cl. .............. 216/13; 216/41; 216/27; 216/2; 204/192.18; 204/192.17; 29/25.35
(58) Field of Search .................. 216/13, 41, 2, 216/27; 347/65; 29/25.35; 204/192.18, 192.17

(56) References Cited

U.S. PATENT DOCUMENTS

| | | | |
|---|---|---|---|
| 3,760,471 A | * 9/1973 | Borner | ................ 29/25.35 |
| 4,443,729 A | 4/1984 | Rider | |
| 4,701,987 A | * 10/1987 | Studer | ................ 29/25.35 |
| 5,019,200 A | 5/1991 | Kawabata et al. | |
| 5,095,725 A | 3/1992 | Wada et al. | |
| 5,177,652 A | 1/1993 | Yamaguchi et al. | |
| 5,189,578 A | 2/1993 | Mori et al. | |
| 5,266,446 A | * 11/1993 | Chang et al. | ................ 430/314 |
| 5,521,778 A | 5/1996 | Boutaghou et al. | |
| 5,584,451 A | 12/1996 | Bonn et al. | |
| 5,636,099 A | 6/1997 | Sugawara et al. | |
| 5,679,586 A | 10/1997 | Rodrigues et al. | |
| 5,712,758 A | 1/1998 | Amano et al. | |
| 5,734,492 A | * 3/1998 | Chung | ................ 359/291 |
| 5,827,382 A | 10/1998 | Ogawa et al. | |
| 5,866,227 A | 2/1999 | Chen et al. | |
| 5,883,651 A | 3/1999 | Thiel et al. | |
| 5,896,246 A | 4/1999 | Budde et al. | |
| 5,936,805 A | 8/1999 | Imaino | |
| 6,025,975 A | 2/2000 | Fard et al. | |
| 6,046,888 A | 4/2000 | Krinke et al. | |
| 6,223,405 B1 | * 5/2001 | Oikawa et al. | ............ 29/25.35 |

* cited by examiner

*Primary Examiner*—Nadine G. Norton
*Assistant Examiner*—Shamim Ahmed
(74) *Attorney, Agent, or Firm*—Merchant & Gould P.C.

(57) ABSTRACT

A process for fabricating piezoelectric elements each having a wrap-around electrode to be used in a differential actuator design where electrical connection is made to the bottom electrode of the element from the top surface of the element. The wrap-around electrode is formed during the creation of the elements instead of on an element by element basis.

18 Claims, 5 Drawing Sheets

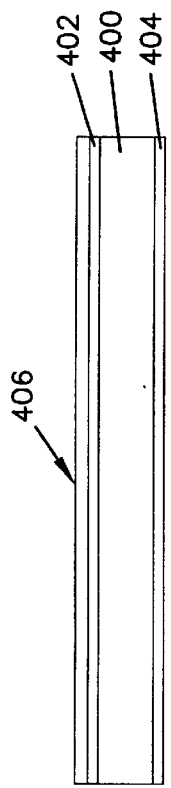
FIG. 5 APPLY PHOTORESIST TO ELECTRODED SUBSTRATE
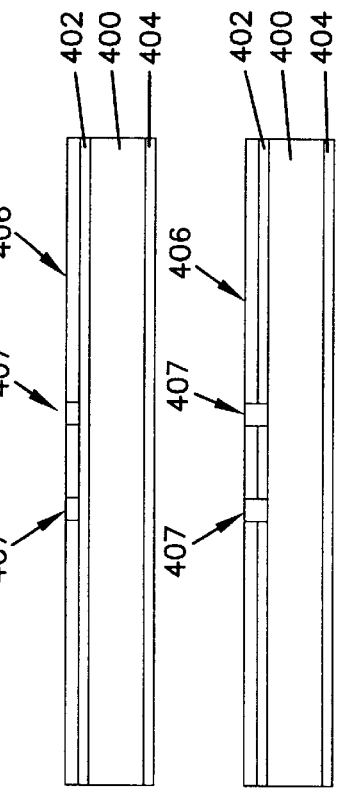
FIG. 6 PATTERN PHOTORESIST
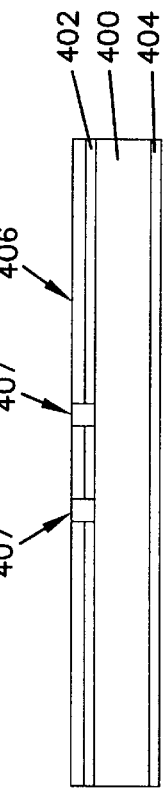
FIG. 7 ETCH THE TOP ELECTRODE ISOLATION TRENCHES
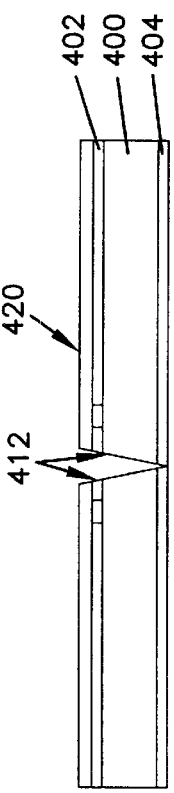
FIG. 8 REMOVE FIRST PHOTORESIST LAYER AND APPLY A SECOND; DICE WITH A TAPERED BLADE
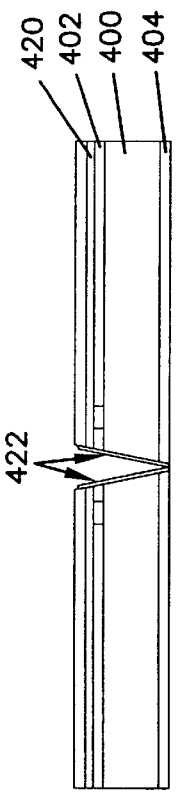
FIG. 9 DEPOSIT WRAP AROUND ELECTRODES
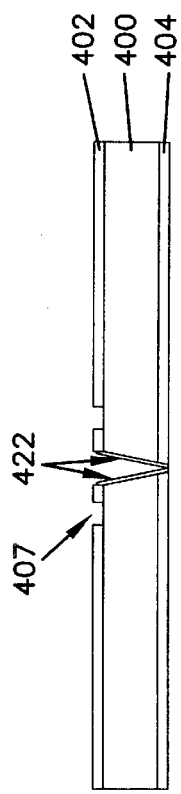
FIG. 10 FINISH DICING AND STRIP OFF PHOTORESIST

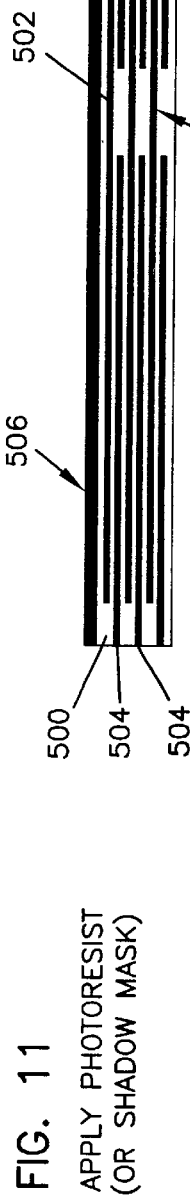
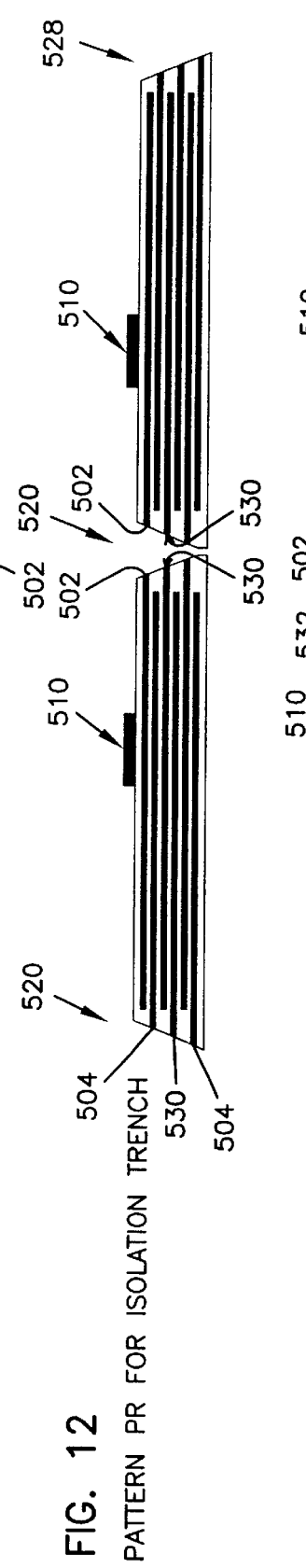
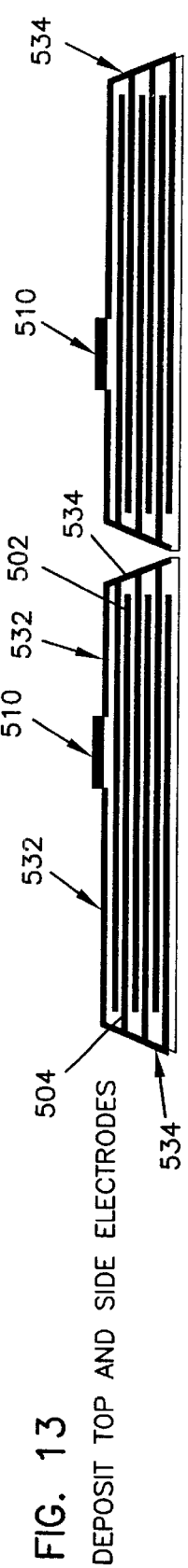
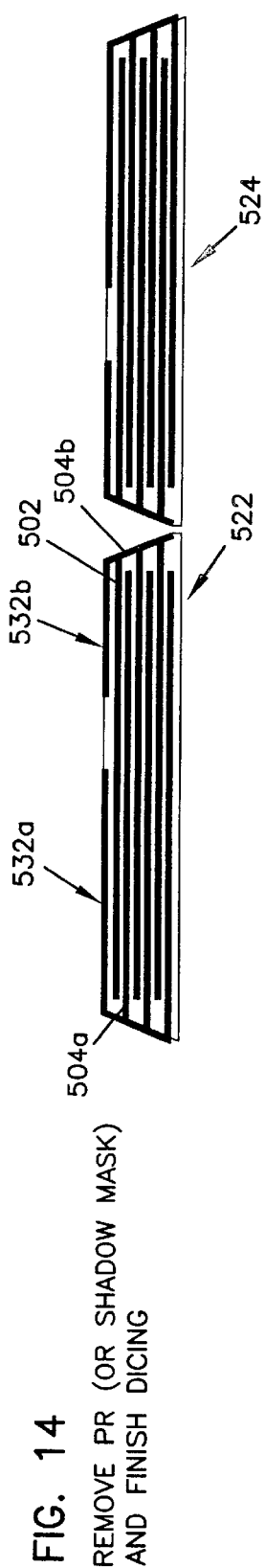
FIG. 11
APPLY PHOTORESIST
(OR SHADOW MASK)
FIG. 12
PATTERN PR FOR ISOLATION TRENCH
FIG. 13
DEPOSIT TOP AND SIDE ELECTRODES
FIG. 14
REMOVE PR (OR SHADOW MASK)
AND FINISH DICING

ELECTRODE PATTERNING FOR A DIFFERENTIAL PZT ACTIVATOR

This application is a 371 of International Application No. PCT/US00/10601, filed Apr. 20, 2000, which claims the benefit of Provisional Application Ser. No. 60/254,966, filed Apr. 20, 1999 for "Electrode Patterning for a Differential PZT Activator," by John Stuart Wright and Zine Eddine Boutaghou.

BACKGROUND OF THE INVENTION

The present invention relates to a differential piezoelectric actuator to be used in a disc drive, and more particularly, to the fabrication of a differential piezoelectric actuator.

Radial track density in disc drives continues to increase, resulting in an increased need for extremely precise head positioning systems. Voice coil motor (VCM) actuators are well-suited to effect coarse positioning, but lack the resolution to finely position and center a transducing head over a selected track. This inadequacy has led to a variety of proposals for a second stage microactuator to effect fine positioning in high track density disc drives.

The microactuator proposals have taken several forms, from an electrostatic microactuator attached to the slider carrying the transducing head, to a piezoelectric microactuator installed at the head suspension mounting block at a distal end of the actuator arm.

With respect to piezoelectric microactuators, there are currently two schemes for driving piezoelectric materials in secondary microactuators. The first is a single ended driving scheme where the piezoelectric material is attached with a conductive epoxy-solder paste to a stainless steel suspension which acts as the bottom electrode and electrical connection is made only to the top electrode. The second is a differential design driving scheme where the piezoelectric material is electrically isolated from the suspension and electrical connection is made to both the top and bottom electrodes of the piezoelectric element.

An advantage of the single ended design is its ease of manufacturing, as only one electrical connection to the small and fragile piezoelectric element is necessary. However, to maintain a class II UL listing, the voltage supplied to the piezoelectric element must be limited to +/−20 volts. Such a voltage is below that necessary to achieve the desired stroke. On the other hand, the differential design allows +/−40 volts to be supplied to the piezoelectric element which allows the desired stroke to be achieved. The differential design, however, complicates fabrication because electrical connection to both the top and bottom electrodes is needed. In addition, because the piezoelectric element is small and fragile, there is greater risk in the element becoming damaged during the fabrication process.

Thus, it is desirable to provide a fabrication process for a differential design that is simple and costs less than conventional processes of fabrication. In addition, it is desirable to provide a differential design that reduces the risk of damage to the piezoelectric element.

SUMMARY OF THE INVENTION

According to a first aspect of the invention, there is provided a method of fabricating piezoelectric elements each having a wrap-around electrode wherein the piezoelectric elements are formed from a sheet of piezoelectric substrate having a top electrode and a bottom electrode covering an entire top and bottom surfaces, respectively, of the substrate. The method includes the steps of:

(a) creating an isolation trench in the top electrode;
(b) exposing the substrate along a first direction to create exposed side surfaces of the substrate wherein the first direction is located remotely from the isolation trench;
(c) depositing an electrode on the exposed side surfaces of the substrate;
(d) exposing the substrate along a second direction to create second exposed side surfaces of the substrate wherein the second direction is locate remotely from the isolation trench on the opposite side of the isolation trench from the first direction wherein the first and second directions define each element's length; and
(e) exposing the substrate along a third direction at multiple points on the substrate wherein defines each element's width.

According to a second aspect of the invention, there is provided a method of fabricating a plurality of piezoelectric elements each having a wrap-around electrode wherein the process starts with a piezoelectric substrate having a top surface covered by a top electrode. The method includes the steps of:

(a) creating a discontinuity in the top electrode within a defined length for each piezoelectric element to be fabricated wherein the discontinuity divides the top electrode into a first top electrode and a second top electrode in each defined length;
(b) dicing through the top electrode and the substrate adjacent to each discontinuity to form an exposed side surface;
(c) depositing an electrode on the exposed side surface;
(d) dicing through the top electrode and the substrate substantially parallel to the dicing of step (b) but located remotely therefrom wherein the dicing steps (b) and (d) define a length of each element; and
(e) dicing through the top electrode and the substrate substantially perpendicularly to the dicing of steps (b) and (d) to define the width of each element.

According to a third aspect of the invention, there is provided a method of fabricating a plurality of piezoelectric elements each having a wrap-around electrode, wherein the process starts with a piezoelectric substrate having a top surface covered by a top electrode and a bottom surface covered by a bottom electrode. The method includes the steps of:

(a) creating a discontinuity in the top electrode within a defined length for each piezoelectric element to be fabricated;
(b) creating a via through the second top electrode wherein the via is electrically coupled to the bottom electrode;
(c) dicing through the top electrode, substrate and bottom electrode on each side of the vias to define each elements length; and
(d) dicing through the top electrode, substrate and bottom electrode in a direction perpendicular to the dicing of step (c) to define each elements width.

BRIEF DESCRIPTION OF THE DRAWINGS

FIGS. 5–10 illustrate the fabrication process according to a preferred embodiment of the present invention.

FIGS. 11–14 illustrate the fabrication process for multi-layered microactuators according to a preferred embodiment of the invention.

DETAILED DESCRIPTION OF THE PREFERRED EMBODIMENTS

In order for electrical connection to be made only to the top surface of a piezoelectric element (also known as a die) in a differential design, the electrode on the top surface must be divided into two portions so that each portion is electrically isolated from the other. In addition, one of the portions must wrap around the substrate of the element and be electrically coupled to the electrode on the bottom surface of the substrate. It is known to fabricate such a wrap around electrode on an individual element by element basis, i.e., at the die level. More particularly, a top and bottom electrode are disposed on a top and bottom surface, respectively, of a sheet of piezoelectric material or substrate. The individual elements or dies are then diced from the sheet. A discontinuity is then formed in the top electrode to create two portions that are electrically isolated from one another and then the wrap around electrode is formed to electrically couple one of the portions of the top electrode to the bottom electrode. Electrical connection can then be made to the top and bottom electrodes from the top surface of the element. The terms "top" and "bottom" are used to indicate relative position and the present invention is not limited to any particular orientation.

Figure 1:
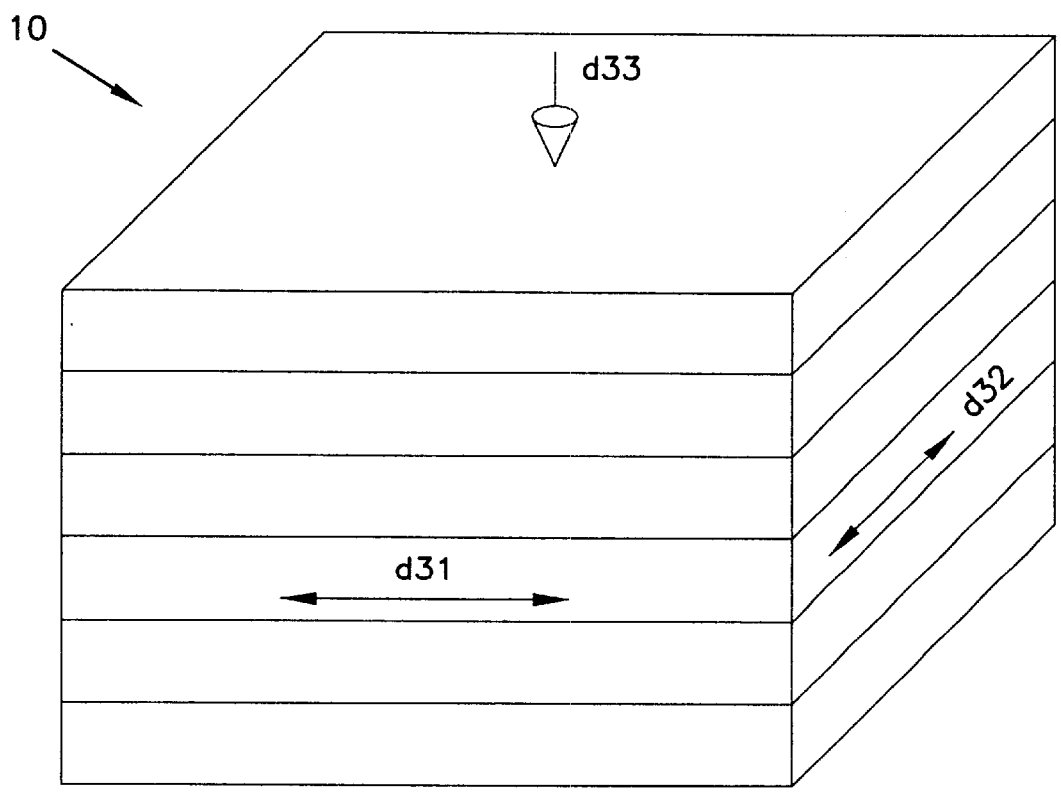
FIG. 1 is a perspective view of a stacked piezoelectric element.

FIG. 1 is a simplified perspective view of a stacked piezoelectric element 10. Element 10 is shown with three axes labeled d31, d32 and d33. A potential difference between spatially separated points along the d33 axis causes expansion or contraction of element 10 in the d31, d32 and/or d33 directions, depending on the polarization of the piezoelectric crystal layers making up element 10. Thus, piezoelectric element 10 can be used to supply an expanding or contracting force in the d31, d32 and/or d33 directions based on an applied voltage.

Figure 2:
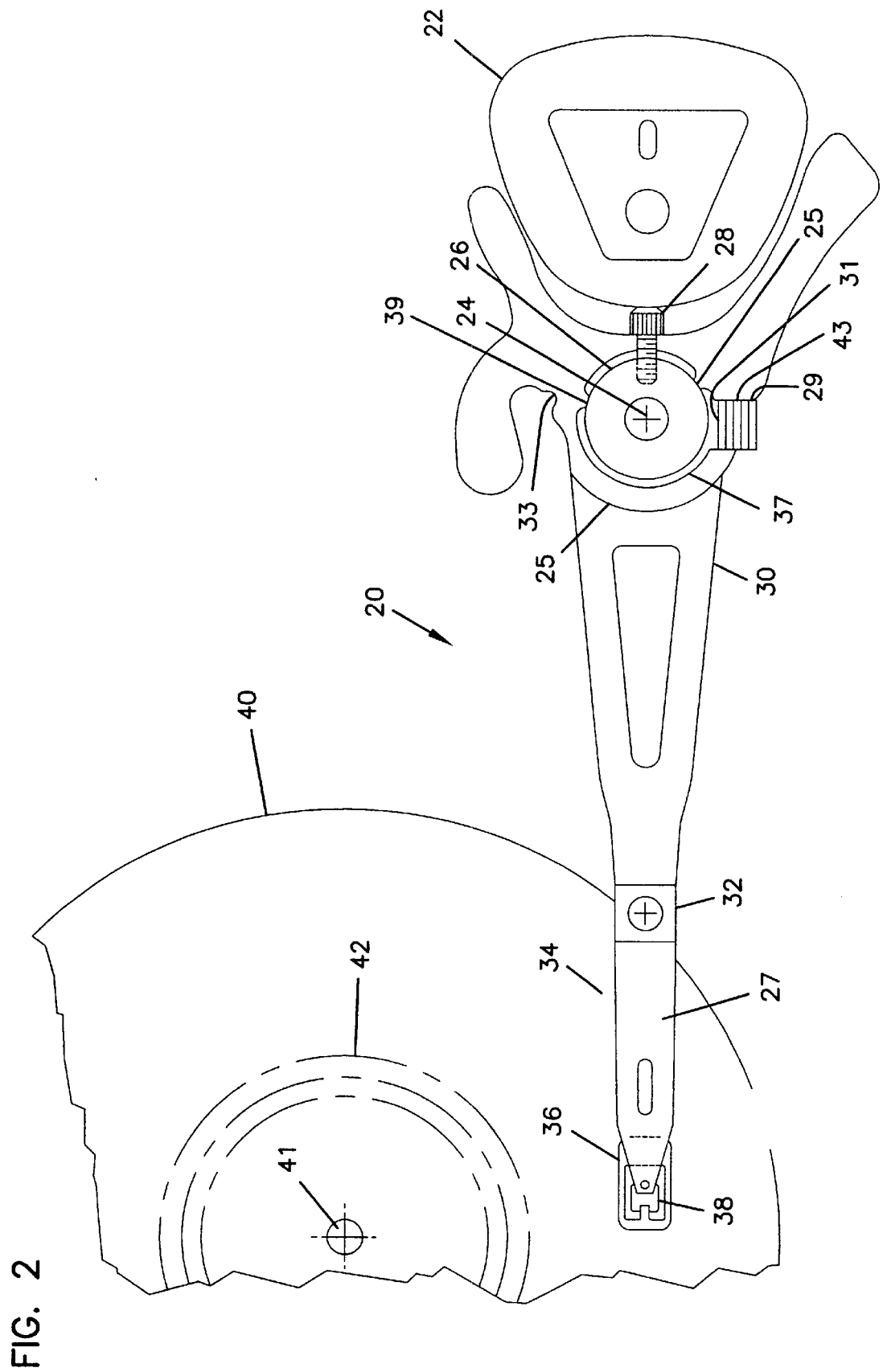
FIG. 2 is a plan view of a disc drive actuation assembly utilizing a piezoelectric microactuator according to the present invention.

FIG. 2 is a plan view of a disc drive actuation assembly 20 incorporating the piezoelectric microactuator according to a preferred embodiment of the present invention. Disc drive actuation assembly 20 includes a voice coil motor (VCM) 22, E-block body 25, load beam 34 coupled to an actuator arm 30 at head mounting block 32, and gimbal 36 coupled to a distal end of load beam 34 to support slider 38, which in turn carries a transducing head. Pivot cartridge 26 is provided in cavity 37 in E-block body 25, and is preferably rigidly fastened to E-block body 25 at one end, such as by one or more screws 28. Microactuator 27 is provided on the load beam 34 and includes terminals (not shown) which couple the element to the drive electronics (not shown).

The VCM 22 is operated in a manner known in the art to rotate E-block 25 and pivot cartridge 26 around axis 24 and thereby coarsely position slider 38, and thus transducer head (not shown), over selected tracks 42 of a disc 40 rotating around axis 41. For more precise movements, microactuator 27 is selectively expanded or contracted along its d31 axis by applying a voltage to the terminals (not shown) coupled to the element thereby altering the position of the slider 38 and thus transducer head (not shown) with respect to the tracks 42 of disc 40.

Figure 3:
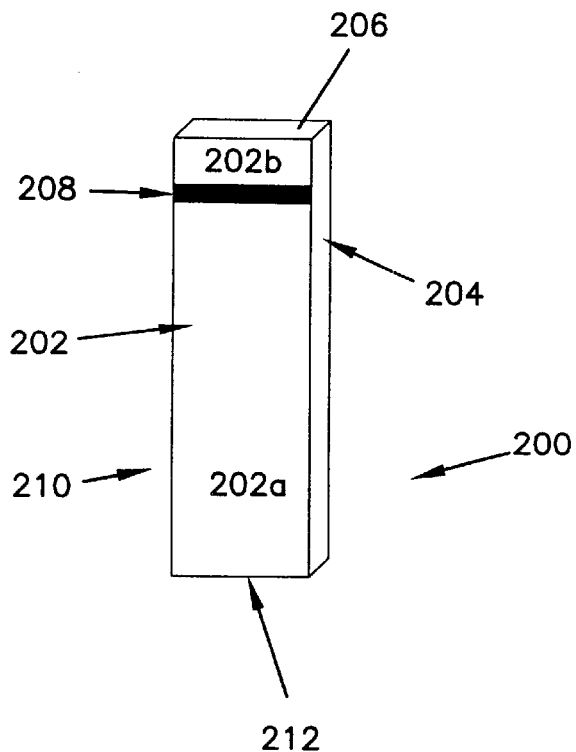
FIG. 3 is a perspective view of a piezoelectric element according to a preferred embodiment of the present invention.

FIG. 3 is a perspective view of a piezoelectric element according to a preferred embodiment of the present invention. The element 200 is three dimensional and is rectangular in shape. It has a top surface 202, a bottom surface (not shown) and side surfaces coupling the top and bottom surfaces only two of which 204, 206 are shown. The element 200 is formed by a piezoelectric substrate having a top and bottom electrode formed thereon. The top electrode 202 has a discontinuity 208 formed therein to separate the top electrode 202 into two portions 202a, 202b that are electrically isolated from one another A wrap-around electrode is also deposited or formed on side 206. The remaining sides of which only one is shown 204, do not have electrodes formed thereon. The wrap-around electrode 206 electrically couples the portion 202b of the top electrode 202 to the bottom electrode (not shown). Thus, electrical connection to the top and bottom electrode are achieved from the top surface of the element via portions 202a, 202b respectively. As previously mentioned, the formation of the wrap-around electrode has heretofore been created on an element by element basis. Because the fabrication process is at the die level, fabricating elements using this technique is costly and time consuming since each element is individually processed. The present invention, contrarily, creates elements with wrap-around electrodes during the creation of the elements, i.e., at the substrate level.

The fabrication process will now be described with reference to FIGS. 4–10.

Figure 4:
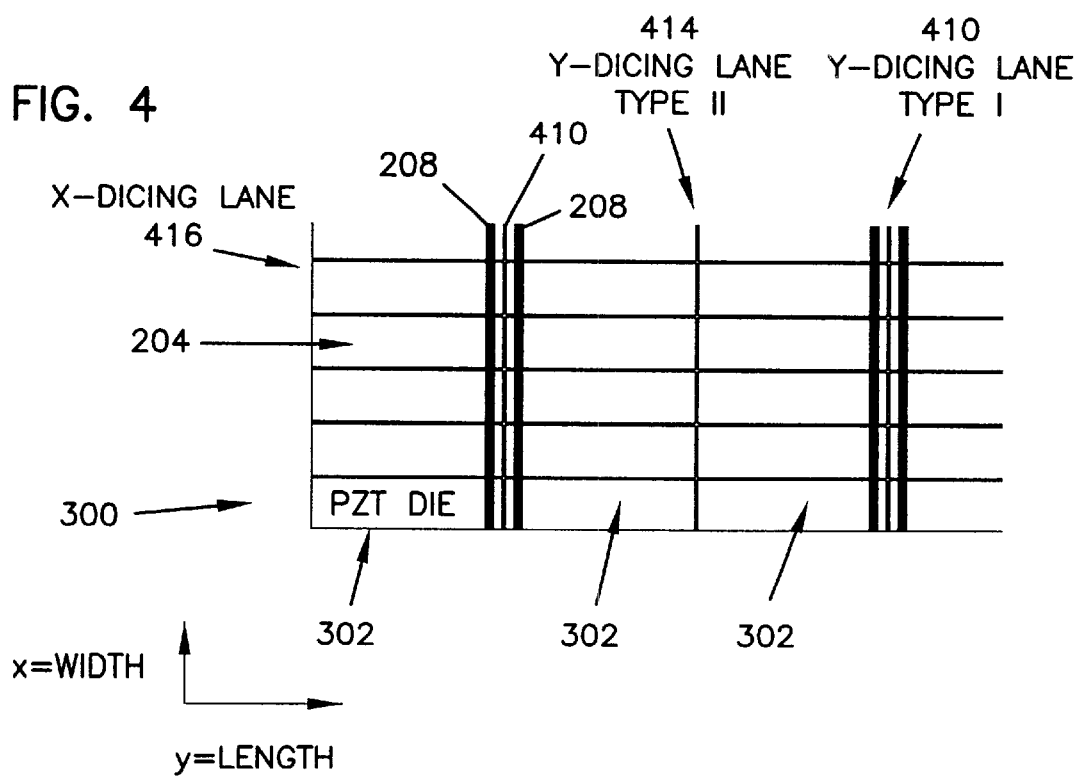
FIG. 4 is a plan view of a sheet of piezoelectric material processed using the fabrication technique according to a preferred embodiment of the present invention.

FIG. 4 is a plan view of a sheet of piezoelectric material processed using the fabrication technique according to a preferred embodiment of the present invention. An electrode layer (represented by the non-dark regions) is first formed over the top and bottom surfaces of the piezoelectric substrate, only the top of which is shown in FIG. 4. The dark lines 208 represent discontinuities formed in the top electrode where the electrode has been removed. The process to create the discontinuities or trenches in the top electrode is shown in FIGS. 5 and 6. First a layer of photoresist 406 is deposited over the top electrode 402. The layer of photoresist 406 can be deposited by any well known technique. Then the layer of photoresist 406 is patterned preferably using well known photolithography techniques to create openings 407 in the photoresist layer 406. Then the portion of the top electrode 402 located underneath the openings 407 in the photoresist layer 406 is removed using either a well known wet etch technique or a well known ion milling technique as shown in FIG. 6. The first layer of photoresist 406 is removed and then a new layer 420 of photoresist is deposited or formed over the entire top surface including the discontinuities 407 as shown in FIG. 7. The substrate is mounted to a UV release tape on a tape frame.

Next the steps for forming or creating the wrap-around electrode will be described according to a preferred embodiment of the invention. The substrate is diced along a first "y dicing" lane 410 to expose side surfaces 412 of the substrate. In a preferred embodiment, a tapered dicing blade or saw is used to create the tapered exposed side surfaces shown in FIG. 8. From FIG. 4 it can be seen that the length of each element is defined along the y axis and each element's width is defined along the x axis. The side surfaces are generally tapered relative to the top surface of the substrate when a tapered dicing blade is used. Alternatively, a regular dicing blade can be used to create perpendicular exposed side surfaces. In FIG. 4, multiple "y dicing" lanes 410 are shown. A wrap-around electrode 422 is then formed on exposed surfaces 412. More particularly, electrode 422 is deposited preferably by well known sputtering techniques onto side surfaces 412 as shown in FIG. 9. Preferably gold (Au) is sputtered onto the exposed surfaces at low power and hence low temperature to prevent heating the substrate to half of its Curie temperature. The substrate is again diced at a second "y dicing" lane 414 located remotely from the first "y dicing" lane to define the length of the elements 302 as shown in FIGS. 4 and 10. Finally, as seen in FIG. 4, the width of each element is determined by "x dicing" lanes 416. The final step involves stripping away the layer of photoresist 420. Thus a differential piezoelectric element with top down connection to the bottom electrode is created at the substrate level as opposed to the element by element technique of the prior art.

In a preferred embodiment, with respect to FIG. 3, portion 202a is about 0.10 inches and portion 202b is about 0.005 inches. The discontinuity 208 preferably has a length of about 0.005 inches. The "x dicing" lanes 416 are preferably about 0.0015 inches thick and define the width of each element which preferably is about 0.03 inches. The "y dicing" lanes 410, 414 are also preferably about 0.0015 inches thick and define the length of each element which preferably is about 0.110 inches.

Alternatively, instead of processing the substrate using dicing and sputtering techniques, ion milling can be used. More particularly, after the discontinuities 407 are formed as shown in FIG. 6, a second photolithography step results in preferably 0.005 inch diameter circles patterned in the photoresist on the smaller of the top two electrodes, i.e., portion 202b (see FIG. 3). The substrate is then ion milled as is well known through the thickness of the substrate followed by a sputtering of gold (Au), or alternatively, a seed layer can be deposited first before the gold is sputtered to create vias as are well known. The vias (not shown) provide the top down connection to the bottom electrode.

FIGS. 11–14 illustrate the fabrication process for multilayer actuators according to a preferred embodiment of the invention. As shown in FIG. 11 a substrate 500 having multiple electrodes 502, 504 formed therein is used. Electrodes 502 extend through a major portion of the substrate but do not extend to the ends of the substrate. Electrodes 504 extend from each end of the substrate towards the center but stop short of the center of the substrate. A layer of photoresist 506 is deposited on the top surface of the substrate 500. Alternatively, a shadow mask may be used as is well known to those of ordinary skill in the art. Then, as shown in FIG. 12, the layer of photoresist 506 is patterned to create photoresist segments 510 which will define isolation trenches as will be described hereinafter. In addition, a "y dicing" lane 520 is cut through the substrate 500 to divide the substrate into what will become a first and second multi-layer microactuator 522, 524 (FIG. 14). Preferably a tapered dicing blade or saw is used to create tapered exposed side surfaces 530. While the illustrated process is used to create two microactuators, the same process is used to create a multitude of microactuators and the present invention is not limited to the shown examples.

Then, as shown in FIG. 13 a top and side electrode 532, 534, respectively, are deposited preferably using well known sputtering techniques. Finally, as shown in FIG. 14 the photoresist segments 510 are removed and the substrate is further diced to create individual elements. It can be seen in FIG. 14 that the top electrode 532 of each microactuator is divided into two sections 532a, 532b which are electrically isolated from one another. Top electrode 532a is electrically coupled to electrodes 504 via wrap-around electrode 504a and top electrode 532b is electrically coupled to electrodes 502 via wrap-around electrode 504b. Electrical connection is made to all of the electrodes via top electrodes 532a, b.

There is a danger that gold (Au) coated asperities on the bottom surface of the bottom electrode may touch the suspension through the epoxy used to couple the microactuator to the suspension. Therefore, a low temperature dielectric layer is first deposited on the bottom electrode prior to the above processing steps. Preferably, a dielectric layer of $SiO_2$ is deposited using plasma enhanced chemical vapor deposition (PECVD) at 120° C. Alternatively, an epoxy filled with non-conducting particles may be used to attach the microactuator element to the suspension, which provides standoffs.

While particular materials and dimensions are provided by way of example, the present invention is not limited to those materials and dimensions.

The present invention provides a fabrication process that is on the wafer or substrate level instead of the die level. Thus, a plurality of dies can be fabricated quickly and cost effectively. In addition, the probability of damage to the piezoelectric substrate is reduced.

The above specification, examples and data provide a complete description of the manufacture and use of the invention. Since many embodiments of the invention can be made without departing from the spirit and scope of the invention, the invention resides in the claims hereinafter appended.

What is claimed is:

1. A method of fabricating piezoelectric elements each having a wrap-around electrode wherein the piezoelectric elements are formed from a sheet of piezoelectric substrate having a top electrode and a bottom electrode covering an entire top and bottom surfaces, respectively, of the substrate, the method comprising the steps of:
   (a.) creating an isolation trench in the top electrode;
   (b.) exposing the substrate along a first direction to create first exposed side surfaces of the substrate, wherein the first direction is located remotely from the isolation trench;
   (c.) depositing an electrode on the first exposed side surfaces of the substrate;
   (d.) exposing the substrate along a second direction to create second exposed side surfaces of the substrate wherein the second direction is located remotely from the isolation trench on the opposite side of the isolation trench from the first direction wherein the first and second directions define a length of each element; and
   (e.) exposing the substrate along a third direction at multiple points on the substrate and defines a width of each element.

2. The method of claim 1 wherein step (a) comprises the steps of:
   (a)(i) depositing a first layer of photoresist on the top electrode; and
   (a)(ii) etching away the first layer of photoresist to create the isolation trench.

3. The method of claim 1 further comprising a step (f) of depositing a second layer of photresist on the opt electrode and isolation trench before step (b).

4. The method of claim 2 wherein step (a)(ii) is a wet etch.

5. The method of claim 1 wherein step (b) comprises the step of dicing through the top electrode, substrate and bottom electrode.

6. The method of claim 4 wherein step (c) comprises the step of sputtering the electrode on the exposed side surface of the substrate.

7. The method of claim 1 wherein step (b) comprises the step of ion milling through the top electrode and the substrate along the first direction to create vias.

8. The method of claim 7 wherein step (c) comprises the steps of (c)(i) first depositing a seed layer in the vias followed by a step (c)(ii) of sputtering the electrode on the seed layer.

9. The method of claim 1 wherein steps (d) and (e) comprise the step of dicing through the top electrode, substrate and bottom electrode.

10. A method of fabricating a plurality of piezoelectric elements each having a wrap-around electrode wherein the process starts with a piezoelectric substrate having a top surface covered by a top electrode, the method comprising the steps of:

(a.) creating a discontinuity in the top electrode within a defined length for each piezoelectric element to be fabricated, wherein the discontinuity divides the top electrode into a first top electrode and a second top electrode in each defined length;

(b.) dicing through the top electrode and the substrate adjacent to each discontinuity to form exposed side surfaces of the top electrode and the substrate;

(c.) depositing an electrode on the exposed side surfaces;

(d.) dicing through the top electrode and the substrate substantially parallel to the dicing of step (b) but located remotely therefrom, wherein the dicing steps (b) and (d) define a length of each element and the dicing step (d) occurs after the depositing step (c); and (e.) dicing through the top electrode and the substrate substantially perpendicularly to the dicing of steps (b) and (d) to define the width of each element.

11. The method of claim 10 wherein the step (a) comprises steps of:

(a)(i) depositing a first layer of photoresist on the top electrode; and (a)(ii) etching away the first layer of photoresist to create discontinuity.

12. The method of claim 10 further comprising a step (f) of depositing a second layer of photoresist on the top electrode and discontinuity before step (b).

13. The method of claim 11 wherein step (a)(ii) is a wet etch.

14. The method of claim 13 wherein the step (c) comprises the step of sputtering the electrode on the exposed side surface of the substrate.

15. A method of fabricating a plurality of piezoelectric elements each having a wrap-around electrode, wherein the process starts with a piezoelectric substrate having a top surface covered by a top electrode and a bottom surface covered by a bottom electrode, the method comprising the steps of:

(a.) creating a discontinuity in the top electrode within a defined length for each piezoelectric element to be fabricated;

(b) dicing through the top electrode, substrate and bottom electrode on each side of the discontinuity to define a length of each element and to expose side surfaces of the top electrode, substrate and bottom electrode;

(c) forming an electrode layer on the exposed side surfaces to electrically connect the top and bottom electrodes; and (d) dicing through the top electrode, substrate and bottom electrode in a direction perpendicular to the dicing of step (c) to define a width of each element.

16. The method of claim 15 wherein step (a) comprises:

(a)(i) depositing a first layer of photoresist on the top electrode; and (a)(ii) etching away the first layer of photoresist to create discontinuity.

17. The method of claim 15 further comprising a step (e) of depositing a second layer of photoresist on the top electrode and discontinuity before step (b).

18. The method of claim 16 wherein step (a)(ii) is a wet etch.

* * * * *